United States Patent
Christensen, III et al.

(10) Patent No.: US 6,968,278 B1
(45) Date of Patent: Nov. 22, 2005

(54) REDUCING THE OCCURRENCE OF SPURS WHEN ANALYZING SIGNALS

(75) Inventors: Paul G. Christensen, III, Rohnert Park, CA (US); Michael Stanley Marzalek, Santa Rosa, CA (US); Joel P. Dunsmore, Sebastopol, CA (US); Donald W. Stark, Santa Rosa, CA (US); Niels Jensen, Santa Rosa, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 125 days.

(21) Appl. No.: 10/688,265

(22) Filed: Oct. 17, 2003

(51) Int. Cl.[7] ............. G01R 13/00; G01R 23/06; H04B 1/26
(52) U.S. Cl. .............. 702/69; 324/95; 455/315
(58) Field of Search .............. 702/67, 69, 76, 702/77; 310/313; 331/96; 324/76.19, 76.21, 324/95, 613; 455/67.15, 73, 315

(56) References Cited

U.S. PATENT DOCUMENTS

| | | | |
|---|---|---|---|
| 5,162,723 A * | 11/1992 | Marzalek et al. | 324/76.19 |
| 5,493,210 A * | 2/1996 | Orndorff et al. | 324/95 |
| 5,633,582 A * | 5/1997 | Orndorff et al. | 324/95 |
| 5,640,697 A * | 6/1997 | Orndorff | 455/315 |
| 6,373,344 B1 * | 4/2002 | Mar | 331/96 |

* cited by examiner

Primary Examiner—Bryan Bui
Assistant Examiner—John Le

(57) ABSTRACT

The occurrence of spurs when analyzing signals is reduced. A first signal is mixed with a local oscillator signal to produce an intermediate signal. When a spur is predicted to occur when high side mixing is performed, low side mixing is performed. When a spur is predicted to occur when low side mixing is performed, high side mixing is performed.

24 Claims, 2 Drawing Sheets

REDUCING THE OCCURRENCE OF SPURS WHEN ANALYZING SIGNALS

BACKGROUND

The present invention concerns signal analysis of microwave and radio frequency signals and pertains particularly to reduce the occurrence of spurs when analyzing signals.

When using a signal analyzer, such as a vector network analyzer, to measure operation of a converter, spurious responses can be generated by feed through from a local oscillator or by harmonics of the local oscillator mixing with internal receiver components in the network analyzer. Depending on the isolation between a radio frequency signal source and intermediate frequency signal generated by the converter, there can also be generation of radio frequency related spurs.

Filtering can be inserted around the converter to reduce the potential for spurs on the signal analyzer display. However, insertion of the filters is inconvenient and is not automatically performed by the signal analyzer. Additionally, when several different frequency bands are being measured, many different filters are required. These filters need to be switched in or out as needed and can contribute errors and uncertainties to the measurements.

SUMMARY OF THE INVENTION

In accordance with the preferred embodiment, the occurrence of spurs when analyzing signals is reduced. A first signal is mixed with a local oscillator signal to produce an intermediate signal. When a spur is predicted to occur when high side mixing is performed, low side mixing is performed. When a spur is predicted to occur when low side mixing is performed, high side mixing is performed.

DETAILED DESCRIPTION OF EMBODIMENTS OF THE INVENTION

Figure 1:
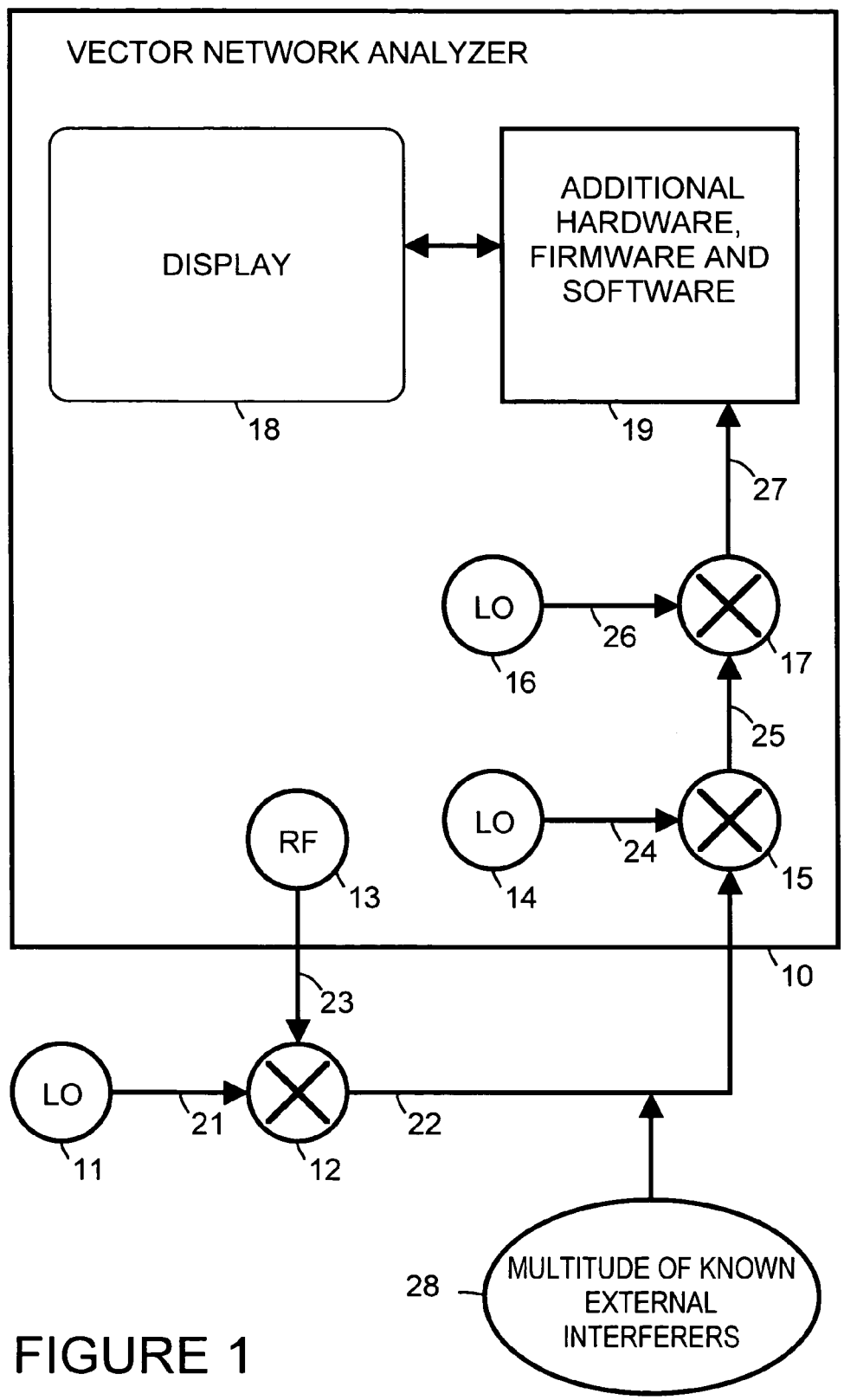
FIG. 1 is a simplified block diagram of a vector network analyzer set up to test a converter.

FIG. 1 shows a vector network analyzer 10 set up to analyze operation of a converter 12. A local oscillator 11 generates a local oscillator signal 21. A radio frequency generator 13 within vector network analyzer 10 generates a radio frequency signal 23. Converter 12 mixes local oscillator signal 21 and radio frequency signal 23 to produce an input frequency signal 22.

Other known signals may be present in some fashion in the test environment which are not derived from mixer signals. These are represented in FIG. 1 as a multitude of known external interferers 28.

A converter 15 within vector network analyzer 10 receives input frequency signal 22. Converter 15 mixes input frequency signal 22 with a local oscillator signal 24 from a local oscillator 14 within vector network analyzer 10 to produce an intermediate frequency signal 25.

A converter 17 within vector network analyzer 10 receives intermediate frequency signal 25. Converter 17 mixes intermediate frequency signal 25 with a local oscillator signal 26 from a local oscillator 16 within vector network analyzer 10 to produce an intermediate frequency signal 27. Additional hardware, firmware and software 19 within vector network analyzer receives intermediate frequency signal 27 and produces a trace that is exhibited on a display 18.

As will be understood by persons of ordinary skill in the art, converter 12 can be tested over a very wide range of frequencies. Likewise, signals with a wide variety of signal frequencies can be generated by local oscillator 11, local oscillator 14, local oscillator 16 and radio frequency generator 13. For explanatory purposes below, examples signal frequencies are given. The combination of signal frequencies chosen for the example below are just one of the unlimited potential combinations of signal frequencies that could be chosen.

In the given example, local oscillator signal 11 has a frequency of 2 gigahertz (GHz), radio frequency signal 23 has a frequency range from 3 to 6 GHz, input frequency signal 22 has a frequency in the range of 5 to 8 GHz, local oscillator signal 24 has a frequency in the range of 5 to 8 GHz±8.33 megahertz (MHz), intermediate frequency signal 25 has a frequency of 8.33 MHz, local oscillator signal 26 has a frequency of 8.33 MHz±41.66 kilohertz (KHz), intermediate frequency signal 25 has a frequency of 41.66 KHz.

For example, as radio frequency signal 23 is stepped through a frequency range from 3 to 6 GHz, local oscillator signal 24 is correspondingly stepped through the frequency range of 5 to 8 GHz±8.33 MHz. When high side mixing is performed, 8.33 MHz is added to obtain the frequency for local oscillator signal 24. When low side mixing is performed, 8.33 MHz is subtracted to calculate the frequency for local oscillator signal 24.

The receiver of a network analyzer may be tuned separately from the source, and as such be used to analyze signals at frequencies other than those of the network analyzer source. Typically, network analyzer receivers have less protection from spurious image signals than traditional signal or spectrum analyzers, therefore it is desirable to have some method to reduce the effects of the spurious signal on the desired measurements.

In one embodiment of the present invention, the frequency of local oscillator signal 24 is varied as necessary to reduce the occurrence of spurs displayed by display 18. Local oscillator signal 24 is varied from high side mixing mode (e.g., 5 to 8 GHz+8.33 MHz) to low side mixing mode (e.g., 5 to 8 GHz–8.33 MHz) in order to avoid spurs. In addition to avoiding spurs resulting from local oscillator signal 24, spurs arising from externally generated known signals and harmonics as well as mixing products of these (represented in FIG. 1 as the multitude of external interferers 28) can be avoided as well.

Figure 2:
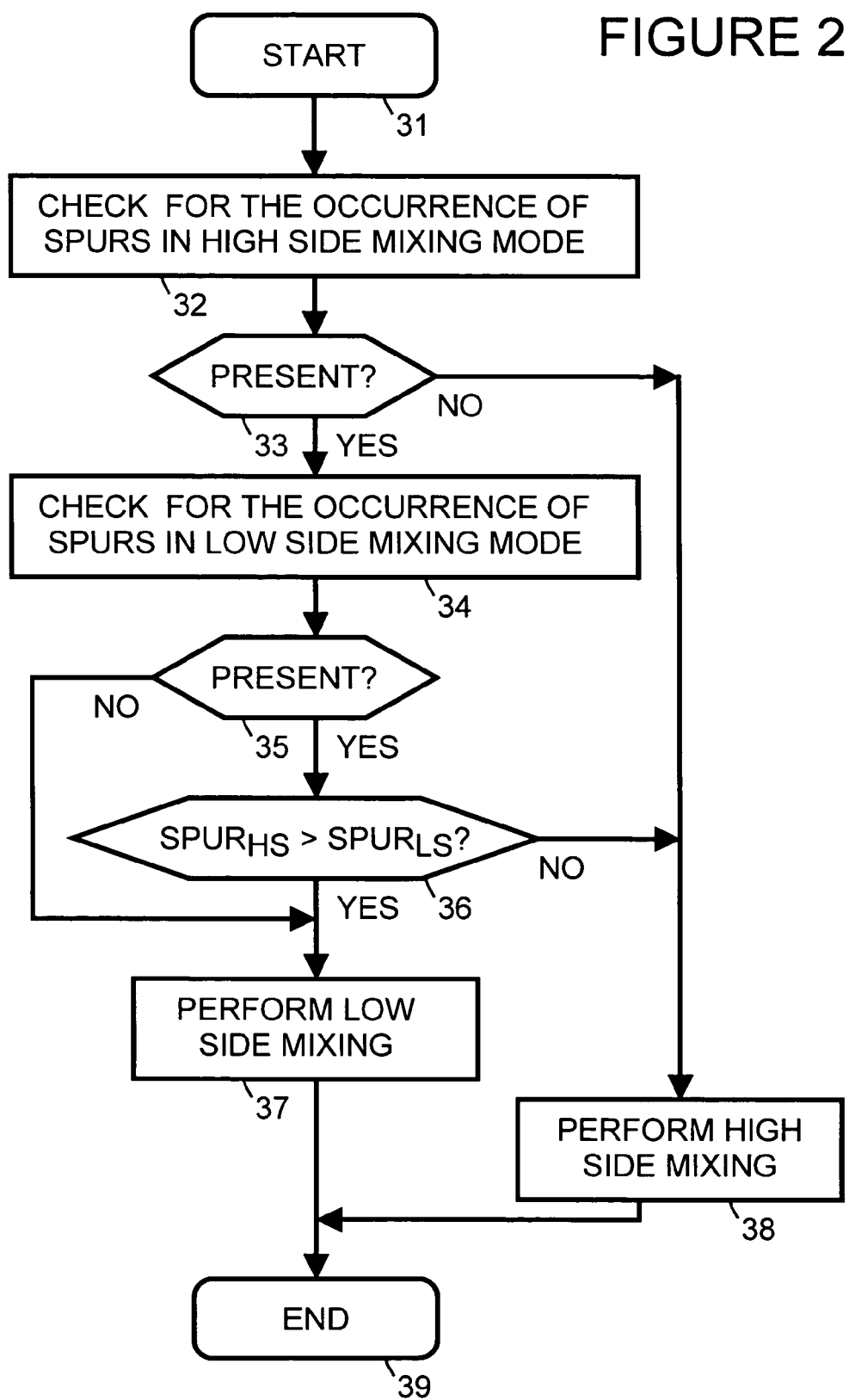
FIG. 2 is a simplified flowchart describing selection of high side mixing or low side mixing based on the predicted appearance of spurs in accordance with an embodiment of the present invention.

FIG. 2 is a simplified flowchart describing selection of high side mixing or low side mixing based on the predicted appearance of spurs. The selection is performed, for example, during test set up by firmware and/or software within vector network analyzer 10. The selection is performed for every frequency step of the test. For example, if there are three hundred frequency steps for radio frequency signal 23 between 3 to 6 GHz (3.01 GHz, 3.02 GHz, 3.03 GHz, . . . ), then there are three hundred frequency steps for local oscillator signal 24 (5.01 GHz±8.33 MHz, 5.02 GHz±8.33 MHz, 5.03 GHz±8.33 MHz, . . . ). At each frequency step, for local oscillator signal 24, a selection is made whether low side mixing or high side mixing will be performed (e.g., select 5.01 GHz+8.33 MHz or 5.01 GHz–8.33 MHz, select 5.02 GHz+8.33 MHz or 5.02

GHz–8.33 MHz, select 5.03 GHz+8.33 MHz or 5.03 GHz–8.33 MHz, . . . ). The results of the selections are, for example, stored in a file so that when testing is performed, the results are accessed to determine for every frequency step whether vector network analyzer performs high side mixing or low side mixing at converter 15.

While in the described embodiment of the present invention, the mode selection is performed in the first converter stage (i.e., by varying the value for local oscillator signal 24). In alternating embodiments, the mode selection can be performed in the second converter stage (i.e., by varying the value for local oscillator signal 26) or can be performed in both the first converter stage and the second converter stage.

In a block 31, performance begins. In a block 32, a check is made for the predicted occurrence of spurs when operating in high side mixing mode. For example, a spur is predicted to occur whenever a harmonic of local oscillator signal 21 interferes with a harmonic of local oscillator signal 24 or a harmonic of local oscillator signal 26. For example, in a preferred embodiment of the present invention, harmonics for local oscillator signal 21, local oscillator signal 24 and local oscillator signal 26 are each checked to the sixth order. In addition to checking for spurs resulting from the interference of harmonics, checks for spurs resulting from feedthrough of local oscillator 11 and radio frequency spurs can also be performed.

From a block 33, if there are no predicted spurs in high side mixing mode, in a block 38, high side mixing is performed for the current frequency step of the test. In a block 39 the selection is over for the current frequency step.

From block 33, if there are predicted spurs in high side mixing mode, in a block 34, a check is made for the predicted occurrence of spurs when operating in low side mixing mode. For example, a spur is predicted to occur whenever a harmonic of local oscillator signal 21 interferes with a harmonic of local oscillator signal 24 or when a harmonic of local oscillator signal 21 interferes with a harmonic of local oscillator signal 26. In addition to checking for spurs resulting from the interference of harmonics of the local oscillators, checks for spurs resulting from feedthrough of local oscillator 11 and radio frequency spurs can also be performed.

From a block 35, if there are no predicted spurs in low side mixing mode, in a block 37, low side mixing is performed for the current frequency step of the test. In a block 39, the selection is over for the current frequency step.

From block 35, if there are predicted spurs in low side mixing mode, in a block 36, the potential size of the predicted spur from high side mixing ($SPUR_{HS}$) is compared to the potential size of the predicted spur from low side mixing ($SPUR_{LS}$). The potential size of the predicted spurs can be calculated using a variety of methods. Typically, the size of the interfering spurious signal diminishes with increasing order, where order refers to the harmonic multiplication of the input signals that create the spurious signal. Also, differing converter designs may be more sensitive to some orders that to others, such that the formula for determining the weights of the spurious may be modified to obtained an optimum weighting for any particular receiver design. The exact formula can be determined in a variety of ways by one skilled in the art. For example, the comparison is performed by a weighting system where a weight to each potential spur is assigned based on the order of the harmonics that occur at the intersecting frequency. For example, the weight is calculated by adding the order of the harmonics of the signals at which the potential spur occurs. The lower the sum of the orders, the higher the weight. Additionally, when the spur calculation is performed, a window or range of frequencies around the instrument IF can be specified as describing how "close" the spur is to being present in the IF of the analyzer (i.e., how close does a spur have to be before high-side, low-side switching takes place). General formulae can be developed that can be modified depending on receiver design to optimize this "closeness" parameter. For example, if a spur for the high side mixing mode is predicted at an interference frequency where a second (2) order harmonic of local oscillator signal 21 interferes with a third (3) order harmonic of local oscillator signal 24, the spur is given a weight of 2+3=5. If a spur for the low side mixing mode is predicted at an interference frequency where a third (3) order harmonic of local oscillator signal 21 interferes with a fourth (4) order harmonic of local oscillator signal 27, the spur is given a weight of 3+4=7. In this system, the weight (5) of the potential spur occurring on the high side mixing mode is greater than the weight (7) of the potential spur occurring on the low side mixing mode.

From block 36, if the potential size of the predicted spur from high side mixing is greater than the potential size of the predicted spur from low side mixing, in a block 37, low side mixing is performed for the current frequency step of the test. In block 39, the selection is over for the current frequency step.

From block 36, if the potential size of the predicted spur from high side mixing is not greater than the potential size of the predicted spur from low side mixing, in a block 38, high side mixing is performed for the current frequency step of the test. In block 39, the selection is over for the current frequency step.

As discussed above, the described embodiment of the present invention reduces the need to add filters to the set up of a converter test. This reduces setup time and the cost of the test.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

What is claimed is:

1. A method for reducing occurrence of spurs when analyzing signals, the method comprising:
   mixing a first signal with a local oscillator signal to produce an intermediate signal, including the following:
      when a spur is predicted to occur when high side mixing is performed but not when low side mixing is performed, performing low side mixing,
      when a spur is predicted to occur when low side mixing is performed, but not when high side mixing is performed, performing high side mixing, and
      when a spur is predicted to occur when high side mixing is performed and a spur is predicted to occur when low side mixing is performed, determining whether the spur that is predicted to occur when high side mixing is performed is greater than the spur that is predicted to occur when low side mixing is performed, and when it is determined that the spur that is predicted to occur when high side mixing is performed is greater than the spur that is predicted to occur when low side mixing is performed, performing low side mixing.

2. A method as in claim 1, wherein mixing the first signal additionally comprises the following:
when a spur is predicted to occur when high side mixing is performed and a spur is predicted to occur when low side mixing is performed, and the spur that is predicted to occur when high side mixing is performed is less than the spur that is predicted to occur when low side mixing is performed, performing high side mixing.

3. A method as in claim 1 wherein the first signal is a result of mixing an external oscillator signal with another signal, and a spur is predicted to occur when a harmonic of the local oscillator signal interferes with a harmonic of the external oscillator signal.

4. A method as in claim 1 wherein the first signal is an intermediate signal within a network analyzer, and a spur is predicted to occur when a harmonic of the local oscillator signal interferes with a harmonic of an external oscillator signal.

5. A method as in claim 1 wherein the first signal is an intermediate signal within a network analyzer, and a spur is predicted to occur when a harmonic of a second local oscillator signal within the network analyzer interferes with a harmonic of an external oscillator signal.

6. A method as in claim 1 wherein spur prediction takes into account fundamentals, harmonics, and mixed products of a multitude of known external interfering sources.

7. A signal analyzer comprising:
an input that receives an input signal; and,
a first converter system, the first converter system including:
a first local oscillator that produces a first local oscillator signal, and
a first converter that mixes the input signal with the first local oscillator signal to produce a first intermediate signal, wherein when a spur is predicted to occur when the first converter system performs high side mixing and not when the first converter system performs low side mixing, the first converter system performs low side mixing, and when a spur is predicted to occur when the first converter system performs low side mixing and not when the first converter system performs high side mixing, the first converter system performs high side mixing;
wherein when a spur is predicted to occur when the first converter system performs high side mixing and a spur is predicted to occur when the first converter system performs low side mixing, the first converter system determines whether the spur that is predicted to occur when the first converter system performs high side mixing is lesser than the spur that is predicted to occur when the first converter system performs low side mixing, and when the first converter system determines that the spur that is predicted to occur when the first converter system performs high side mixing is lesser than the spur that is predicted to occur when the first converter system performs low side mixing, the first converter system performs high side mixing.

8. A signal analyzer as in claim 7:
wherein when a spur is predicted to occur when the first converter system performs high side mixing and a spur is predicted to occur when the first converter system performs low side mixing, and the spur that is predicted to occur when the first converter system performs high side mixing is greater than the spur that is predicted to occur when the first converter system performs low side mixing, the first converter system performs low side mixing.

9. A signal analyzer as in claim 7 wherein a spur is predicted to occur when a harmonic of the first local oscillator signal interferes with a harmonic of an external oscillator signal used to generate the input signal.

10. A signal analyzer as in claim 7 wherein the signal analyzer additionally comprises:
a second converter system, the second converter system including:
a second local oscillator that produces a second local oscillator signal, and
a second converter that mixes the first intermediate signal with the second local oscillator signal to produce a second intermediate signal, wherein when a spur is predicted to occur when the second converter system performs high side mixing, the second converter system performs low side mixing, and when a spur is predicted to occur when the second converter system performs low side mixing, the second converter system performs high side mixing.

11. A signal analyzer as in claim 7 wherein the signal analyzer additionally comprises:
a second converter system, the second converter system including:
a second local oscillator that produces a second local oscillator signal, and
a second converter that mixes the first intermediate signal with the second local oscillator signal to produce a second intermediate signal, wherein a spur is predicted to occur when a harmonic of the second local oscillator signal interferes with a harmonic of an external oscillator signal used to generate the input signal.

12. A signal analyzer as in claim 7 wherein a spur is predicted to occur when a signal generated external to the signal analyzer interferes with a signal generated within the signal analyzer.

13. A signal analyzer as in claim 7 wherein spur prediction takes into account fundamentals, harmonics, and mixed products of a multitude of known external interfering sources.

14. A signal analyzer comprising:
input means for receiving an input signal; and,
first converter means for producing a first intermediate signal, the first converter means including:
first local oscillator means for producing a first local oscillator signal, and
first mixer means for mixing the input signal with the first local oscillator signal to produce the first intermediate signal, wherein when a spur is predicted to occur when the first converter means performs high side mixing and not when the first converter means performs low side mixing, the first converter means performs low side mixing, and when a spur is predicted to occur when the first converter means performs low side mixing and not when the first converter means performs high side mixing, the first converter means performs high side mixing;
wherein when a spur is predicted to occur when the first converter means performs high side mixing and a spur is predicted to occur when the first converter means performs low side mixing, the first converter means determines whether the spur that is predicted to occur when the first converter means performs high side mixing is greater than the spur that is predicted to occur when the first converter means performs low side mixing, and when the first converter means determines the spur that is predicted to occur when the first converter means performs high side mixing is greater than the spur that is predicted to occur when the first converter means performs low side mixing, the first converter means performs low side mixing.

15. A signal analyzer as in claim 14:
wherein when a spur is predicted to occur when the first converter means performs high side mixing and a spur is predicted to occur when the first converter means performs low side mixing, and the spur that is predicted to occur when the first converter means performs high side mixing is lesser than the spur that is predicted to occur when the first converter means performs low side mixing, the first converter means performs high side mixing.

16. A signal analyzer as in claim 14 wherein a spur is predicted to occur when a harmonic of the first local oscillator signal interferes with a harmonic of an external oscillator signal used to generate the input signal.

17. A signal analyzer as in claim 14 wherein the signal analyzer additionally comprises:
second converter means for producing a second intermediate signal, the second converter means including:
second local oscillator means for producing a second local oscillator signal, and
second mixer means for mixing the first intermediate signal with the second local oscillator signal to produce the second intermediate signal, wherein when a spur is predicted to occur when the second converter means performs high side mixing, the second converter means performs low side mixing, and when a spur is predicted to occur when the second converter means performs low side mixing, the second converter means performs high side mixing.

18. A signal analyzer as in claim 14 wherein the signal analyzer additionally comprises:
second converter means for producing a second intermediate signal, the second converter means including:
second local oscillator means for producing a second local oscillator signal, and
second mixer means for mixing the first intermediate signal with the second local oscillator signal to produce the second intermediate signal, wherein a spur is predicted to occur when a harmonic of the second local oscillator signal interferes with a harmonic of an external oscillator signal used to generate the input signal.

19. A signal analyzer as in claim 14 wherein a spur is predicted to occur when a signal generated external to the signal analyzer interferes with a signal generated within the signal analyzer.

20. A signal analyzer as in claim 14 wherein spur prediction takes into account fundamentals, harmonics, and mixed products of a multitude of known external interfering sources.

21. A method for reducing occurrence of spurs when a signal analyzer analyzes signals from a device under test, the method comprising:
mixing a first signal, generated external to the signal analyzer by the device under test, with a local oscillator signal to produce an intermediate signal, including the following:
when a spur is predicted to occur as a result of high side mixing of the first signal with the local oscillator signal but not as a result of low side mixing of the first signal with the local oscillator signal, performing low side mixing, and
when a spur is predicted to occur as a result of low side mixing of the first signal with the local oscillator signal but not as a result of high side mixing of the first signal with the local oscillator signal, performing high side mixing.

22. A method as in claim 21 wherein the device under test is a mixer located external to the signal analyzer.

23. A signal analyzer comprising:
an input that receives an input signal generated external from the signal analyzer by a device under test; and,
a first converter system, the first converter system including:
a first local oscillator that produces a first local oscillator signal, and
a first converter that mixes the input signal with the first local oscillator signal to produce a first intermediate signal, wherein when a spur is predicted to occur when the first converter system performs high side mixing and not when the first converter system performs low side mixing, the first converter system performs low side mixing, and when a spur is predicted to occur when the first converter system performs low side mixing and not when the first converter system performs high side mixing, the first converter system performs high side mixing.

24. A signal analyzer as in claim 23 wherein the device under test is a mixer located external to the signal analyzer.

* * * * *